US012575433B2

(12) United States Patent
Lu et al.

(10) Patent No.: US 12,575,433 B2
(45) Date of Patent: Mar. 10, 2026

(54) SEMICONDUCTOR PACKAGE AND METHOD OF MANUFACTURING THE SAME

(71) Applicant: Taiwan Semiconductor Manufacturing Company, Ltd., Hsinchu (TW)

(72) Inventors: Kuan-Chung Lu, Hsinchu (TW); Bo-Tao Chen, Taipei City (TW); An-Jhih Su, Taoyuan City (TW); Ming-Shih Yeh, Hsinchu County (TW); Der-Chyang Yeh, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 515 days.

(21) Appl. No.: 18/152,777

(22) Filed: Jan. 11, 2023

(65) Prior Publication Data

US 2024/0096811 A1     Mar. 21, 2024

Related U.S. Application Data

(60) Provisional application No. 63/407,733, filed on Sep. 19, 2022.

(51) Int. Cl.
H01L 23/538 (2006.01)
H01L 23/00 (2006.01)
(Continued)

(52) U.S. Cl.
CPC ...... H01L 23/5389 (2013.01); H01L 23/3128 (2013.01); H01L 24/12 (2013.01);
(Continued)

(58) Field of Classification Search
None
See application file for complete search history.

(56) References Cited

U.S. PATENT DOCUMENTS

| | | | |
|---|---|---|---|
| 9,000,584 | B2 | 4/2015 | Lin et al. |
| 9,048,222 | B2 | 6/2015 | Hung et al. |
| (Continued) | | | |

FOREIGN PATENT DOCUMENTS

| | | |
|---|---|---|
| TW | 202205594 | 2/2022 |
| TW | 202226509 | 7/2022 |

OTHER PUBLICATIONS

"Office Action of Taiwan Counterpart Application", issued on Jan. 30, 2024, p. 1-p. 6.

*Primary Examiner* — Cory W Eskridge
(74) *Attorney, Agent, or Firm* — JCIPRNET

(57) ABSTRACT

The present disclosure provides a package structure and a method of manufacturing a package. The package structure includes a semiconductor die laterally encapsulated by an encapsulant, a redistribution structure and bumps. The redistribution structure is disposed on the semiconductor die and the encapsulant, and is electrically connected with the at least one semiconductor die. The bumps are disposed on the redistribution structure. The redistribution structure includes dielectric layers and metallic pattern layers sandwiched between the dielectric layers. The redistribution structure includes metallic pads on an outermost dielectric layer of the dielectric layers, and the outmost dielectric layer has undercut cavities beside the metallic pads.

20 Claims, 13 Drawing Sheets

(51) Int. Cl.
    *H01L 23/31*       (2006.01)
    *H01L 25/065*     (2023.01)

(52) U.S. Cl.
    CPC .............. *H01L 24/19* (2013.01); *H01L 24/32*
        (2013.01); *H01L 24/48* (2013.01); *H01L 24/73*
          (2013.01); *H01L 25/0655* (2013.01); *H01L*
            *2224/12105* (2013.01); *H01L 2224/19*
        (2013.01); *H01L 2224/32245* (2013.01); *H01L*
          *2224/48091* (2013.01); *H01L 2224/73267*
           (2013.01); *H01L 2924/181* (2013.01)

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2008/0274603 A1* | 11/2008 | Do | H01L 23/481 |
| | | | 257/E21.211 |
| 2017/0358534 A1* | 12/2017 | Kim | H01L 23/3114 |
| 2020/0126850 A1* | 4/2020 | Kuo | H01L 24/97 |
| 2021/0050317 A1* | 2/2021 | Southworth | H01L 24/03 |

\* cited by examiner

SEMICONDUCTOR PACKAGE AND METHOD OF MANUFACTURING THE SAME

CROSS-REFERENCE TO RELATED APPLICATION

This application claims the priority benefit of U.S. provisional application Ser. No. 63/407,733, filed on Sep. 19, 2022. The entirety of the above-mentioned patent application is hereby incorporated by reference herein and made a part of this specification.

BACKGROUND

With the growing demand for miniaturization, higher speed, greater bandwidth and lower power consumption, there is a need for smaller and more creative packaging for semiconductor dies. Following the reduction of product sizes, a redistribution circuit structure that copes with the miniaturization scheme is one of key factors for future packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
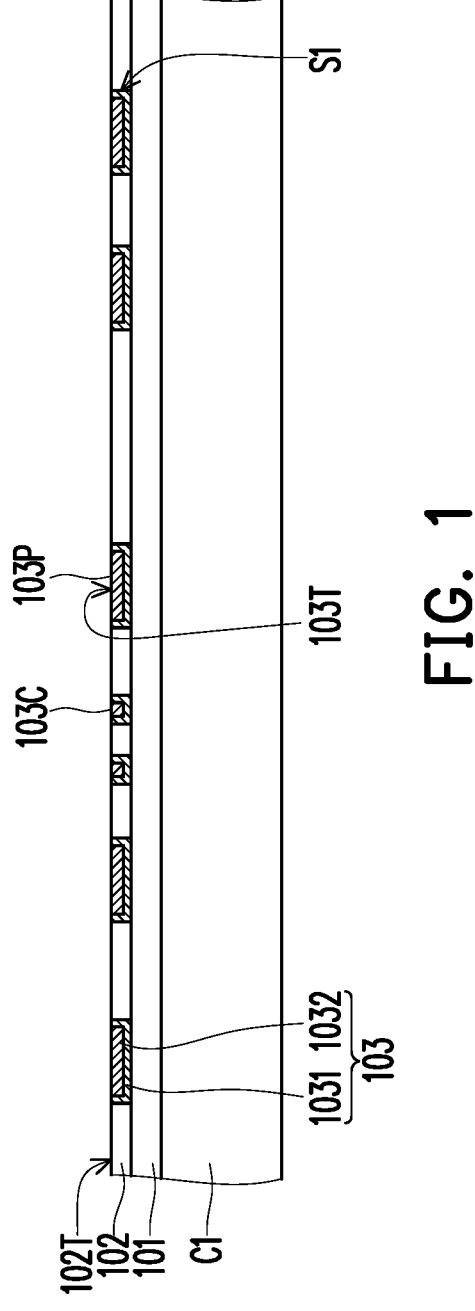
FIG. 1 to FIG. 10 are schematic cross-sectional views illustrating various stages of a method of manufacturing a semiconductor package in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

It should be appreciated that the following embodiment(s) of the present disclosure provides applicable concepts that can be embodied in a wide variety of specific contexts. The specific embodiment(s) discussed herein is merely illustrative and is related to a package structure or assembly, and does not limit the scope of the present disclosure. Embodiments of the present disclosure describe the exemplary manufacturing process of wafer-level packaging and the package structures fabricated there-from. Certain embodiments of the present disclosure are related to the package structures formed with die bonding structures and stacked dies and/or wafers. The dies may include one or more types of integrated circuits or electrical components on a bulk semiconductor substrate or a silicon/germanium-on-insulator substrate. The embodiments are intended to provide further explanations but are not used to limit the scope of the present disclosure.

FIG. 1 to FIG. 10 are schematic cross-sectional views illustrating various stages of a method of manufacturing a semiconductor package in accordance with some embodiments of the present disclosure. FIG. 4, FIG. 6, FIG. 7 and FIG. 9 are schematic enlarged views of a portion of the intermediate structures of the semiconductor package according to some embodiments of the present disclosure.

Referring to FIG. 1, a carrier C1 having a debond layer 101 formed thereon is provided. In some embodiments, a first dielectric layer 102 is formed with openings Si, and a first metallic pattern layer 103 is formed within the openings Si. As seen in FIG. 1, the debond layer 101 is located between the carrier C1 and the first dielectric layer 102 and between the carrier C1 and the first metallic pattern layer 103. In some embodiments, the carrier C1 is a glass substrate, the debond layer 101 includes a light-to-heat conversion (LTHC) release layer formed on the glass substrate. In some embodiments, the debond layer 101 includes a release coating film made of an ultra-violet (UV) glue, which loses its adhesive property when exposed to UV lights. In certain embodiments, the debond layer 101 may be dispensed as a liquid and cured, or may be a laminate film laminated onto the carrier C1. In certain embodiments, the debond layer 101 is, for example, a LTHC layer with good chemical resistance, and such layer enables room temperature debonding from the carrier C1 by applying laser irradiation.

In some embodiments, the material of the first dielectric layer 102 includes a non-oxide dielectric material or a polymeric material such as polyimide (PI), polybenzoxazole (PBO), benzocyclobutene (BCB), or other suitable polymer-based dielectric materials. In some embodiments, the material of the first dielectric layer 102 includes polyimide. In some embodiments, the first dielectric layer 102 is formed by coating, lamination or chemical vapor deposition (CVD). In some embodiments, the formation of the first dielectric layer 102 involves forming a polyimide layer by spin coating and thermal treating for curing the polyimide layer, and then the polyimide layer is patterned to form openings Si therein.

Referring to FIG. 1, in some embodiments, the first metallic pattern layer 103 includes metallic pads 103P and metallic contacts 103C. In some embodiments, the metallic pads 103P include under-ball metallurgy (UBM) patterns for bump mounting, and the metallic contacts 103C are for mounting of passive components such as resistors, capacitors, inductors or the like. In some embodiments, the materials of the first metallic pattern layer 103 includes copper, titanium, nickel, cobalt, In some embodiments, the formation of the first metallic pattern layer 103 involves forming a lining material layer (not shown) blanketly over the first dielectric layer 102 and over the openings Si, and filling a metallic material (not shown) on the seed material layer into the openings Si, and then a planarization process such as a chemical mechanical polishing (CMP) process is performed to remove the extra lining material and metallic material above the first dielectric layer 102 to form the lining layer 1031 and the metallic patterns 1032. In some embodiments, after the planarization process, the top surface 103T of the first metallic pattern layer 103 that includes the lining layer 1031 and the metallic pattern 1032 is levelled with and flush with the top surface 102T of the first dielectric layer 102. In some embodiments, the lining layer 1031 includes a titanium/copper (Ti/Cu) composite layer functioning as a seed layer, and optionally other metal nitride such as titanium nitride as barrier materials. For example, the seed layer 1031 may be formed by physical vapor deposition (PVD) such as sputtering, CVD or other suitable process. In some embodiments, the metallic material of the metallic patterns 1032 is formed through a CVD process, a plating process such as electrochemical plating (ECP) or the combination thereof. In some embodiments, the metallic material includes copper (Cu) or copper alloys formed by electroplating. However, it is appreciated that the scope of this disclosure is not limited to the materials and descriptions disclosed above. As the lining layer 1031 is rather thin without obvious interface, the lining layer will not be depicted in the following figures for simplicity. In the following figures, in some embodiments, the first dielectric layer 102 and the first metallic pattern layer 103 together are referred to as the first tier.

Figure 2:
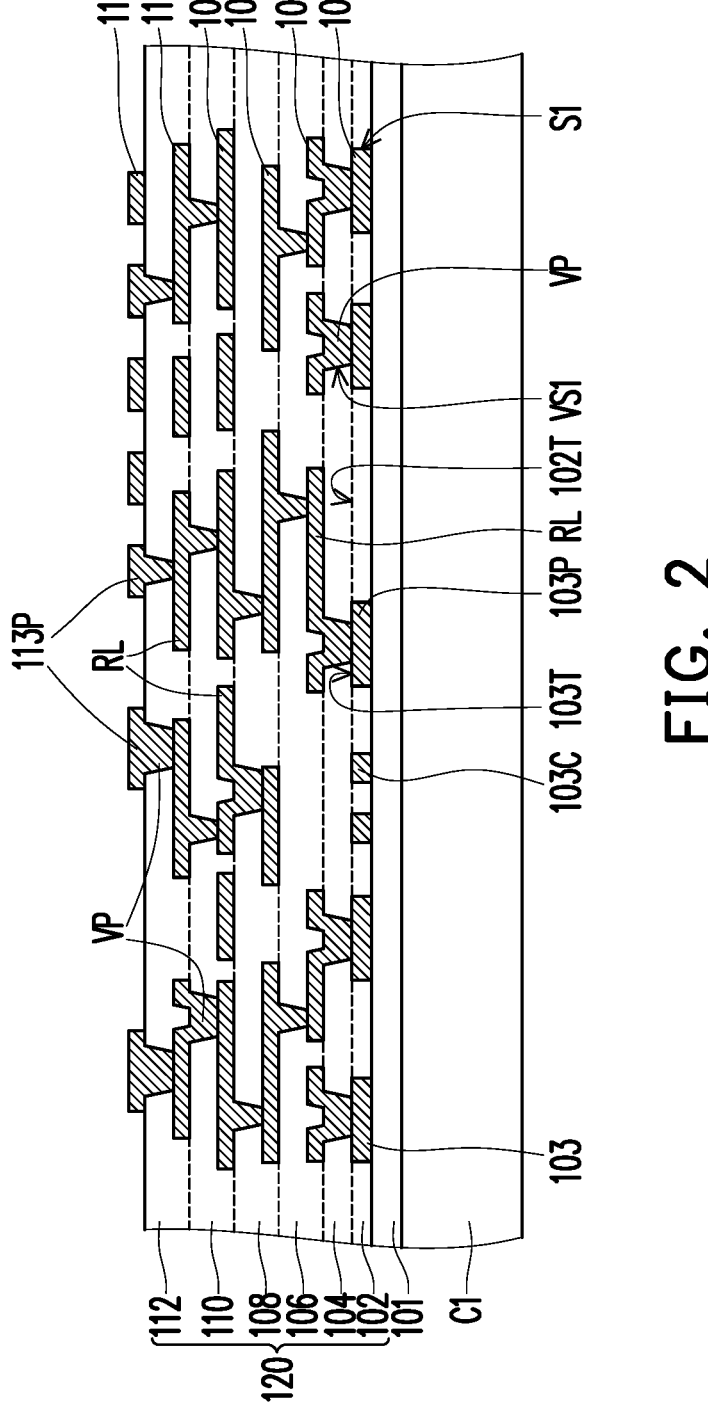

Referring to FIG. 2, after the first metallic pattern layer 103 is formed, a second dielectric layer 104, a second metallic pattern layer 105, a third dielectric layer 106, a third metallic pattern layer 107, a fourth dielectric layer 108, a fourth metallic pattern layer 109, a fifth dielectric layer 110, a fifth metallic pattern layer 111, a sixth dielectric layer 112, and a sixth metallic pattern layer 113 are sequentially formed over the first tier (on the first dielectric layer 102 and the first metallic pattern layer 103), so that a redistribution structure 120 is formed. Depending on the number of the layers to be formed, these processes may be repeated several times, and the layers may be expressed based on the formation sequence. It is noted that the number of the metallic pattern layers and the number of the dielectric layers of the redistribution structure 120 illustrated in FIG. 2 are merely for illustrative purposes, and the disclosure is not limited thereto. In some alternative embodiments, less or more layers of the metallic pattern layers and/or dielectric layers may be formed depending on the product design requirement.

Referring to FIG. 2, in some embodiments, the second dielectric layer 104 is formed over the first tier, covering the first dielectric layer 102 and the first metallic pattern layer 103, and the second dielectric layer 104 is formed with via openings VS1. In some embodiments, some or all of the via openings VS1 expose the underlying metallic pads 103P of the underlying metallic pattern layer 103. Later, the second metallic pattern layer 105 is formed on the second dielectric layer 104 and filling in the via openings VS1. In some embodiments, the second metallic pattern layer 105 include vias VP filled in the via openings VS1 and routing lines RL. In some embodiments, the second dielectric layer 104 and the second metallic pattern layer 105 together are referred to as the second tier. Later, the above processes are repeated, and the third dielectric layer 106 and the third metallic pattern layer 107 (as the third tier), the fourth dielectric layer 108 and the fourth metallic pattern layer 109 (as the fourth tier), the fifth dielectric layer 110 and the fifth metallic pattern layer 111 (as the fifth tier), and the sixth dielectric layer 112 and the sixth metallic pattern layer 113 (as the sixth tier) are respectively and sequentially formed on the second tier. In some embodiments, the metallic pattern layers 107, 109, 111 include vias VP for interconnecting with the below layers and routing lines RL for redistribution. In some embodiments, the sixth metallic pattern layer 113 includes vias VP and bonding pads 113P for receiving bonding connectors. The material(s) and the methods used for forming the dielectric layers 104, 106, 108, 110, 112 and the metallic pattern layers 105, 107, 109, 111, 113 are similar to those materials and methods for forming the first dielectric layer 102 and the first metallic pattern layer 102 respectively, and the details will not be repeated herein for simplicity.

The redistribution structure is a fan-out interconnecting structure and the layout of redistribution layers of the redistribution structure may form fan-out routings for wafer level packaging technology or for integrated fan-out (InFO) packages or package-on-package (PoP) structures. The redistribution layers as demonstrated and described in the above embodiments are applicable for various types of packages and the layout and design of the redistribution layer(s) may be adjusted based on the electrical requirements of the products. Although the frontside redistribution structure is described in the above embodiments, the same or similar structures may be applicable for backside redistribution layers provided in the package structure or arranged on both front side and back side of the die(s).

Figure 3:
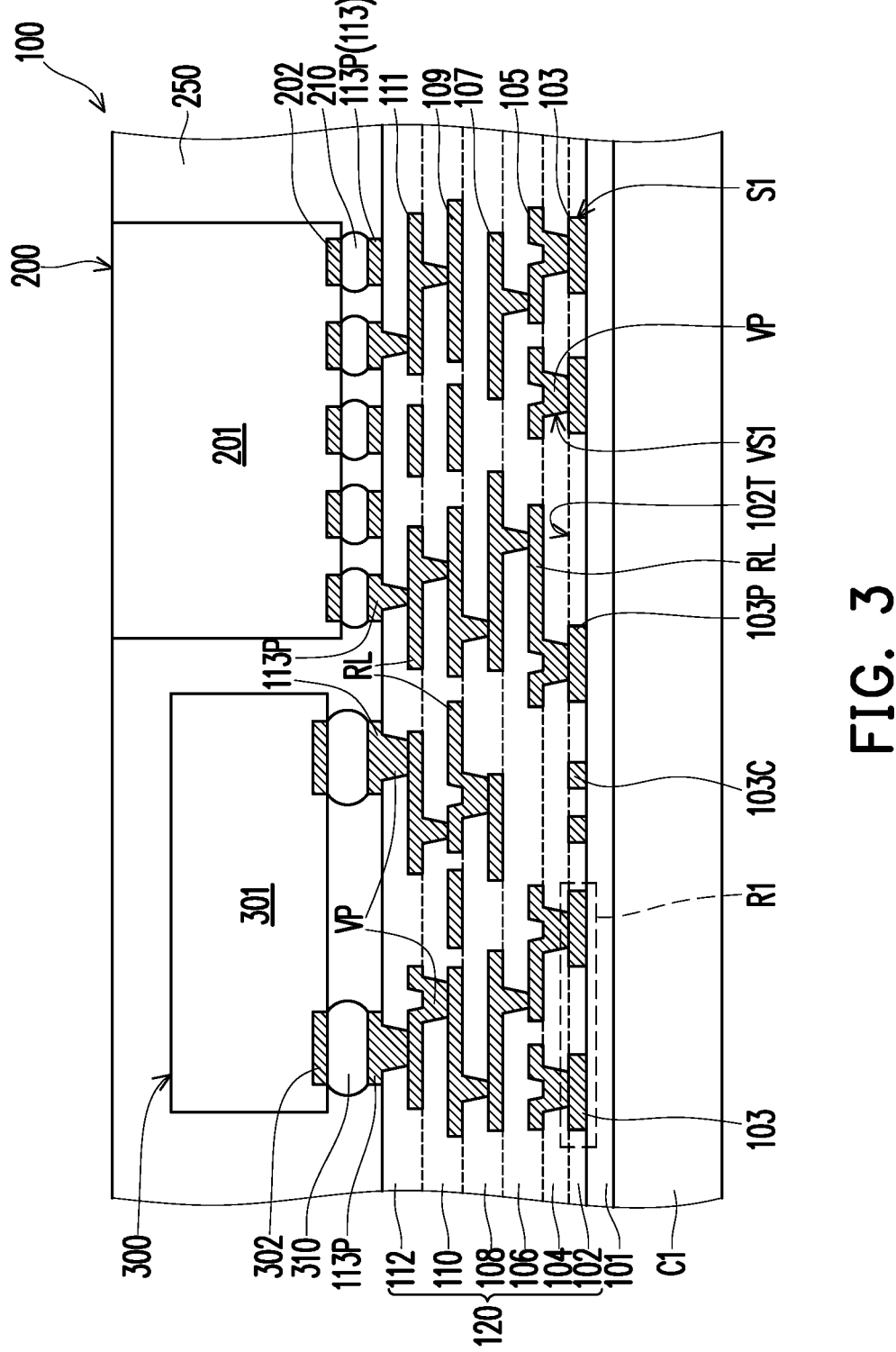

Referring to FIG. 3, semiconductor dies 200 and 300 are picked and placed, and the semiconductor dies 200 and 300 are bonded onto the redistribution structure 120. As seen in FIG. 3, the semiconductor dies 200, 300 are disposed side by side and are spaced apart from each other with a distance. It is understood that the number(s) of the semiconductor dies is not limited to the embodiments herein, and the semiconductor die may be arranged in an array. In some embodiments, the semiconductor dies 200 and 300 have different functions or include chips of different functions. In some embodiments, the semiconductor dies 200 and 300 have different heights (thicknesses). In some embodiments, the semiconductor die 200 includes one or more of an application-specific integrated circuit (ASIC) die, an analog chip, a sensor chip, a wireless application chip (such as a Bluetooth chip or a radio frequency chip), a central processing unit (CPU) die, a graphic processing unit (GPU) die, a micro control unit (MCU) die, a baseband (BB) die, a system-on-chip (SoC) die or a voltage regulator die. In some embodiments, the semiconductor die 300 includes one or more memory chips, such as high bandwidth memory chips, dynamic random access memory (DRAM) chips or static random access memory (SRAM) chips. In some embodiments, the semiconductor die 300 is a memory die including stacked memory chips, and the semiconductor die 200 is a system-on-chip (SoC) die including a controller chip.

In some embodiments, referring to FIG. 3, the semiconductor die 200 includes conductive pads 202 formed on the semiconductor body 201, and the conductive pads 202 on the active surface of the die 200 are connected to the bonding pads 113P of the topmost metallic pattern layer 113 of the redistribution structure 120 through the bonding connectors 210 there-between. In some embodiments, the conductive pads 302 on the active surface of the semiconductor die 300 are connected to the bonding pads 113P of the topmost metallic pattern layer 113 of the redistribution structure 120 through the bonding connectors 310 there-between. In some embodiments, the conductive pads 202 or 302 include aluminum pads, copper pads or other suitable metallic pads. In some embodiments, the bonding connectors 210 or 310 include controlled collapse chip connection (C4) bumps or micro bumps. In some embodiments, the bonding connectors 210 or 310 include copper pillars or other suitable metal pillars with solder paste.

In some embodiments, the semiconductor dies 200 and 300 are electrically connected to the redistribution structure 120, and the redistribution structure 120 may fan-out the contacts of the semiconductor dies 200/300 and further electrically connects the semiconductor dies 200/300 to other package subunits or circuit boards.

Referring to FIG. 3, in some embodiments, an insulating encapsulant 250 is formed over the redistribution structure 120 covering the semiconductor dies 200 and 300. In some embodiments, the insulating encapsulant 250 includes a molding compound formed by a molding process. As shown in FIG. 3, the insulating encapsulant 250 may be formed through over-molding and a planarization process is performed to partially remove the molding compound until the top surface of the die 200 is exposed. In some embodiments, the insulating encapsulant 250 is formed over the dielectric layer 112 to laterally encapsulate the semiconductor die 200 and encapsulate the semiconductor die 300. In some embodiments, the material of the insulating encapsulant 250 includes epoxy resins, phenolic resins or other suitable resin materials and silica fillers. In some embodiments, the planarization process includes performing a mechanical grinding process and/or a CMP process.

Figure 4:
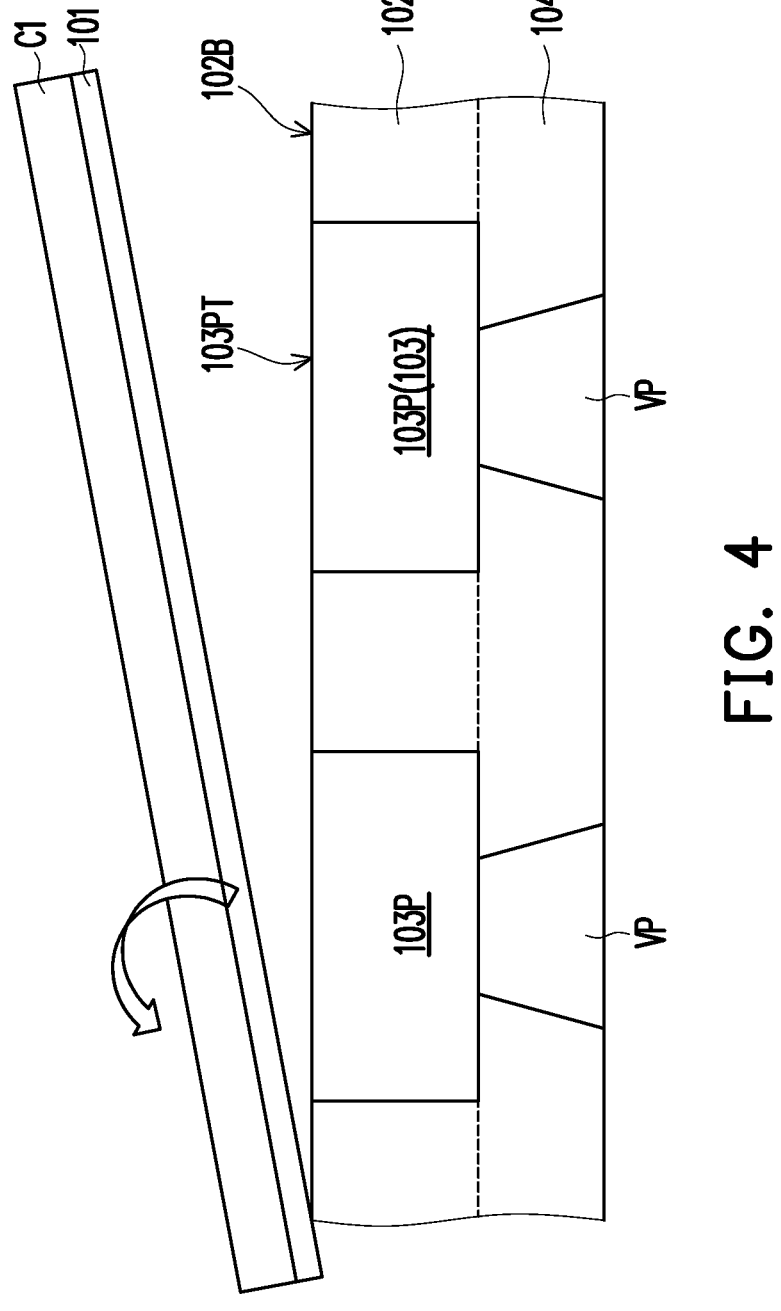
Figure 5:
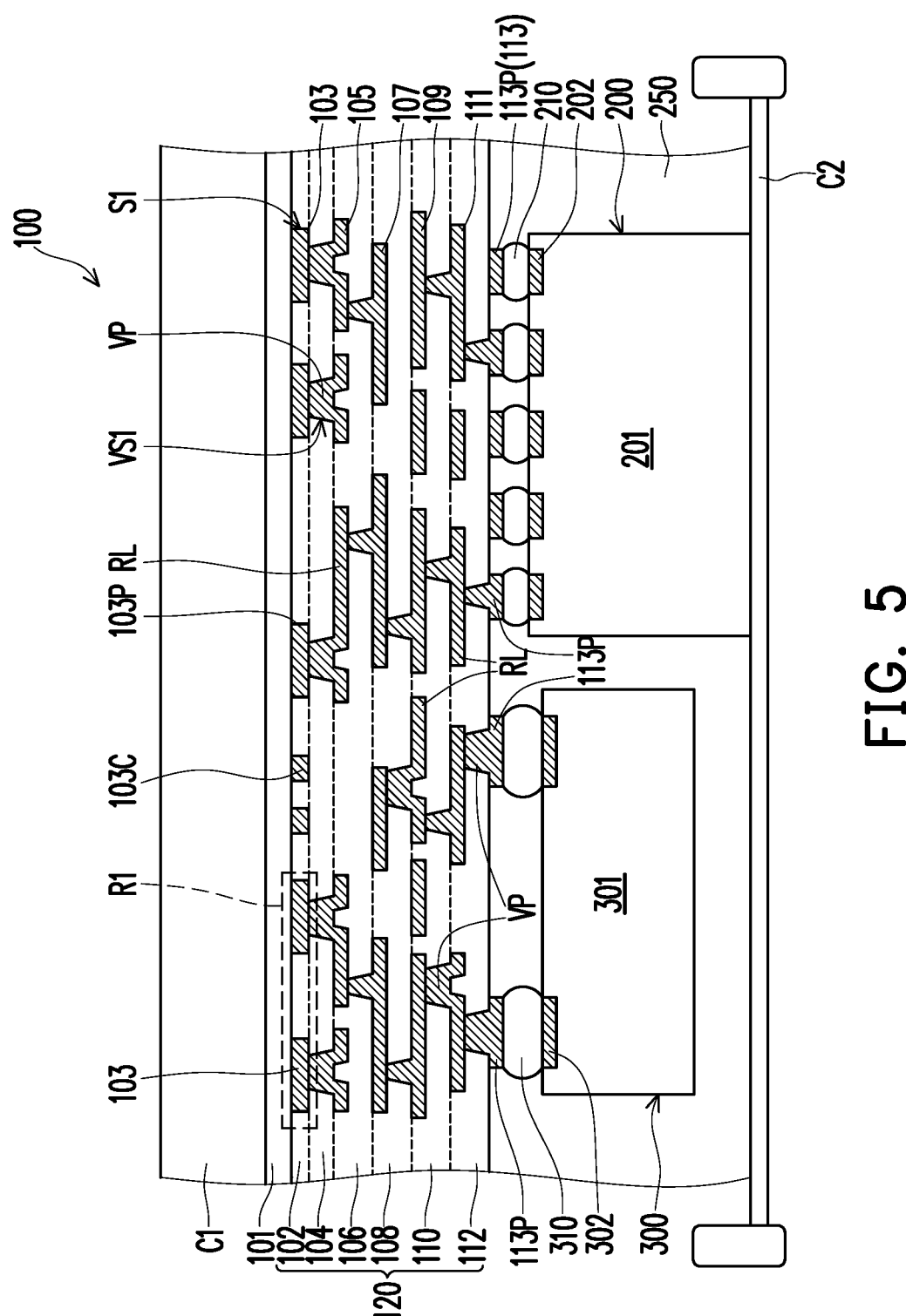

FIG. 4 illustrates the enlarged view of the region R1 of the redistribution structure 120 of FIG. 5.

Referring to FIG. 5 and FIG. 4, after performing the planarization process, the structure 100 is flipped upside down, transferred to a second carrier C2 and the carrier C1 is detached from the structure 100, so that the first dielectric layer 102 and the first metallic pattern layer 103 (including the metallic pads 103P and the metallic contacts 103C) are exposed. As seen in FIG. 4, after detaching the carrier C1, the metallic pads 103P are exposed from the first dielectric layer 102. As seen in FIG. 4 and FIG. 5, the top surfaces 103PT of the metallic pads 103P are flush with and levelled with the surface 102B of the first dielectric layer 102.

Figure 6:
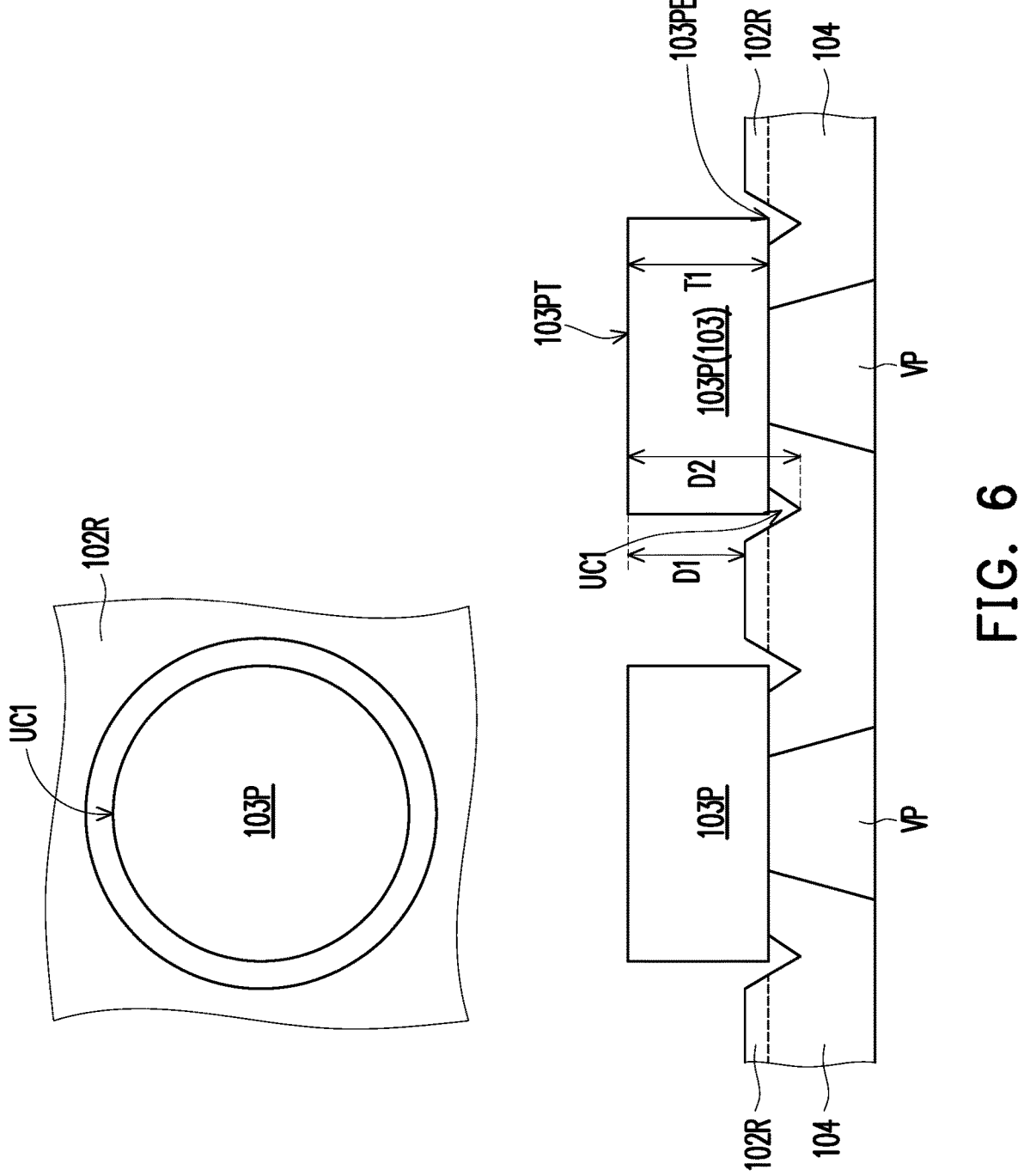

Referring to FIG. 6, in some embodiments, an etching process is performed to recess the first dielectric layer 102 to form a recessed first dielectric layer 102R. In some embodiments, the etching process includes a dry etching process using a fluoride-containing etchant. In one embodiment, the etching process includes performing a plasma etching process using nitrogen and oxygen gases and CF 4 as the etchant. In some embodiments, the etching process is performed to selectively remove the first dielectric layer 102 without damaging the metallic pads 103P. That is, the first dielectric layer 102 is partially removed and recessed to a depth D1. As seen in FIG. 6, as the metallic pads may accumulate charges during the plasma treatment, the first dielectric layer 102 adjacent to the metallic pads 103P, especially near the bottom edges 103PE of the metallic pads 103P, is etched at a higher etching rate, and the underlying second dielectric layer 104 near the edges 103PE of the metallic pads 103P is also etched. Hence, undercut cavities UC1 are formed near the edges 103PE of the metallic pads 103P in the dielectric layers 102R and 104, as over-etching of the dielectric material(s) occurs around the metallic pads 103P. In some embodiments, the bottom edges 103PE of the metallic pads 103P are exposed by the undercut cavities UC1 and spaced apart from the dielectric layers 102R and 104 by the undercut cavities UC1. Herein, the dielectric layers 102R and 104 may be referred to as the outermost dielectric layer with the etched undercut cavities UC1. As seen in the schematic top view at the upper part of FIG. 6, the undercut cavity UC1 is a ring-shaped cavity or hollow trench recessed into the dielectric material with a depth D2 surrounding the metallic pad 103P. As seen in FIG. 6, considering the thickness T1 of the metallic pad 103P, the recessed depth/thickness D1 is about 70% to about 90% of T1, and the depth D2 of the undercut cavity UC1 (measuring from the top surface 103PT of the pad 103P to the bottom of the cavity UC1) is about 150% to about 170% of T1. In one embodiment, the metallic pad 103P has the thickness T1 of about 7 microns to about 7.5 microns, the recessed first dielectric layer 102R is recessed down with the dept D1 of about 5.5 microns to about 6 microns, and the undercut cavity UC1 is formed with a depth D2 ranging from about 11 microns to about 12 microns. In some embodiments, the cavity UC1 is formed as a contiguous ring-shaped trench with a uniform depth. In some embodiments, the cavity UC1 is formed as a close ring-shaped trench with varying depths. In some embodiments, the cavity UC1 may be formed as non-continuous concave void grooves arranged around the metal pad 103P. In some embodiments, depending on the processing conditions, the cross-sectional view of the undercut cavity UC1 may be V-shaped, U-shaped or even W-shaped with slant sidewalls or curved sidewalls.

In some embodiments, during the etching process, the undercut cavities UC1 are also formed around the contact pads 103C as the first dielectric layer 102 is globally etched down, and the over-etching of the dielectric material also occurs around the contact pads.

Figure 7:
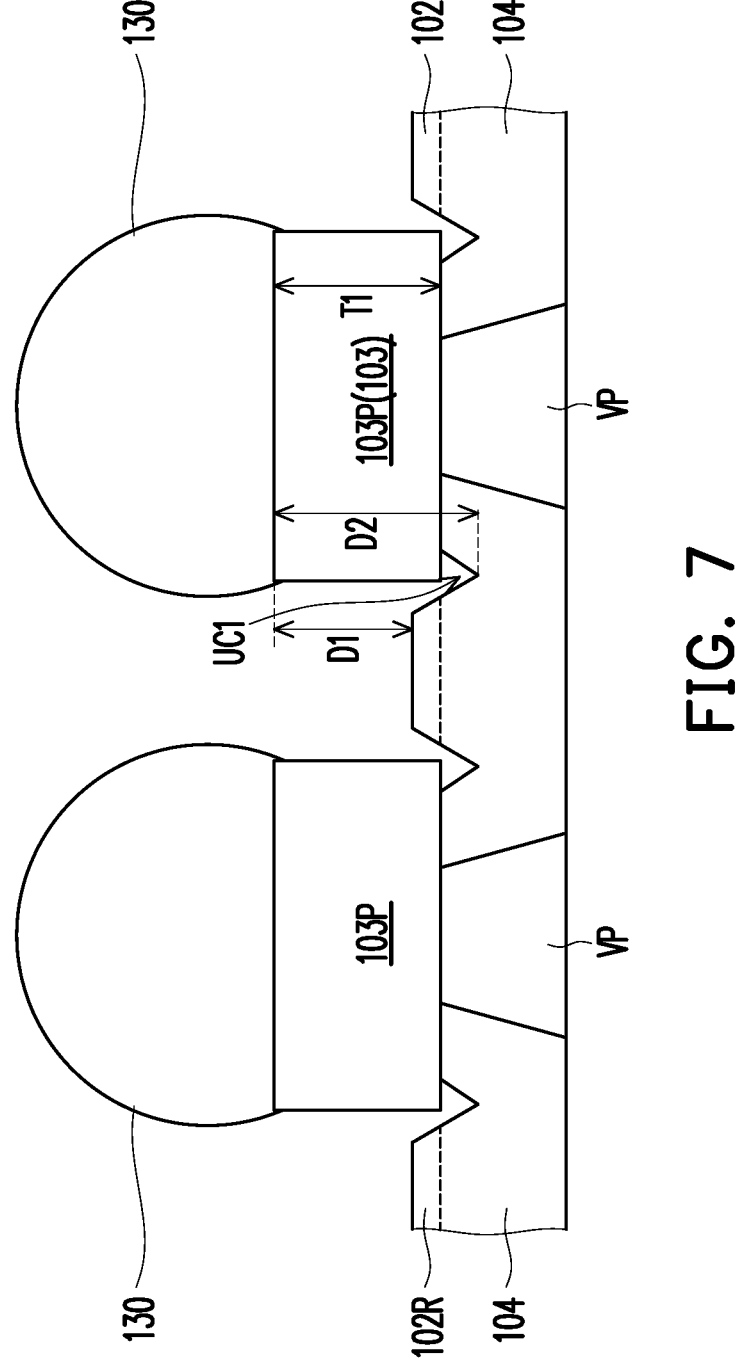

Referring to FIG. 7, bump blocks 130 are formed on the metallic pads 103P of the metallic pattern layer 103. In some embodiments, the bump blocks 130 include a metallic material such as a solder material, and the solder material includes, for example, lead-based solders such as lead-tin (PbSn) alloys, or lead-free solders such as tin-zinc-copper alloys and tin-copper-silver alloys, and traces of other metals including gold, aluminum, bismuth, indium, cobalt, nickel, antimony, etc. In some embodiments, the bump blocks 130 are formed by using electro or electroless plating techniques, screen-printing or jet printing techniques.

Figure 8:
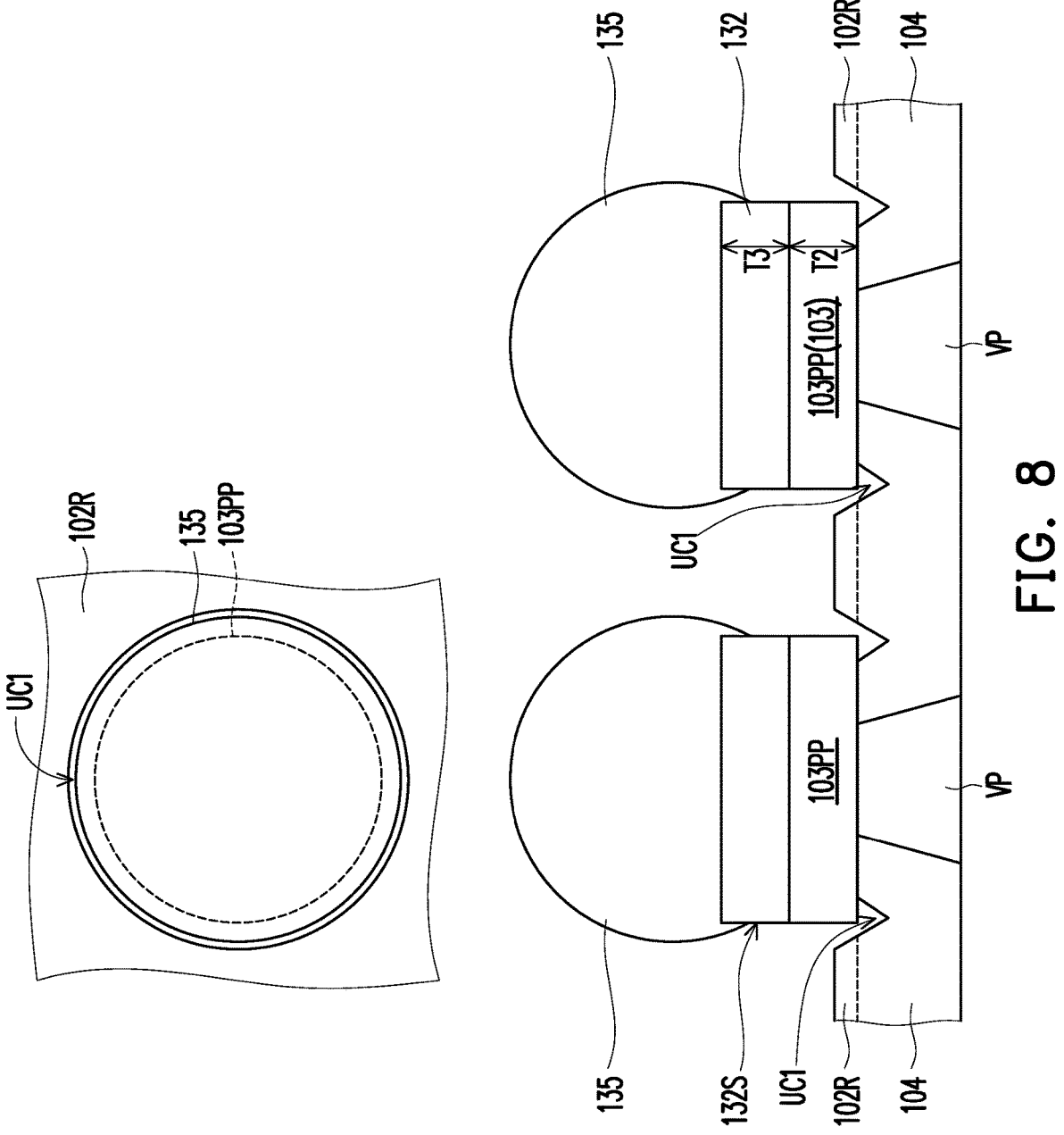

Referring to FIG. 8, a reflow process is performed to fix the bump blocks 130 to the metallic pads 103P to form reflowed bumps 135, and an intermetallic compound (IMC) layer 132 is formed between the bump 135 and the metallic pad 103PP. For example, the reflow process includes a thermal process performed at a temperature above the melting point of the metallic or solder materials. During the thermal process, the metal material(s) of the metallic pads 103P reacts with the metallic or solder material of the bump blocks 130, and the layer of intermetallic compounds (the IMC layer 132) is formed. Referring to FIG. 8, in some embodiments, after the thermal reflow process, due to the formation of the intermetallic compounds, the metallic pads 103P are partially consumed and become the metallic pads 103PP with a reduced thickness T2, and the IMC layer 132 formed between the bump 135 and the metallic pad 103PP has a thickness T3. Depending on the duration and condition of the thermal process, the thickness of the formed IMC layer may vary. In one embodiment, the thickness T2 is about 30% of the thickness T1, and the thickness T3 is about 5 microns. In one embodiment, the thickness T3 is about 2 microns to about 3 microns, and the thickness T2 is about 50% to about 70% of the thickness T1. In some embodiments, the IMC layer 132 includes Cu—Sn intermetallic compounds. As seen in FIG. 8, the reflowed bump 135 covers the sidewalls of the IMC layer 132 but does not cover the sidewalls of the metallic pads 103PP. That is, the IMC layer 132 is located between the bump 135 and the metallic pad 103PP and the bump 135 is physically isolated from the metallic pad 103PP by the IMC layer 132. As seen in the schematic top view at the upper part of FIG. 8, the ring-shaped undercut cavity UC1 (as a hollow trench) surrounds the metallic pad 103PP and surrounds the bump 135, and the orthogonal projection of the bump 135 (onto the top surface of the redistribution structure) is larger than and overlaps with the orthogonal projection of the metallic pad 103PP. From the top view, the undercut cavity UC1 surrounds a span (the outer profile) of the bump 135.

As seen in FIG. 8, due to the existence of the undercut cavity UC1, the recessed first dielectric layer 102R is spaced apart from the IMC layer 132 and the lower edge of the metallic pad 103PP, the formation of the IMC layer 132 will not cause delamination of the underlying dielectric layers of the redistribution structure 120. With the undercut cavity UC1, the thermal stress of the first dielectric layer is relieved and the reliability of the later formed bumps is improved, leading to enhanced reliability and yields of the package structure.

Figure 9:
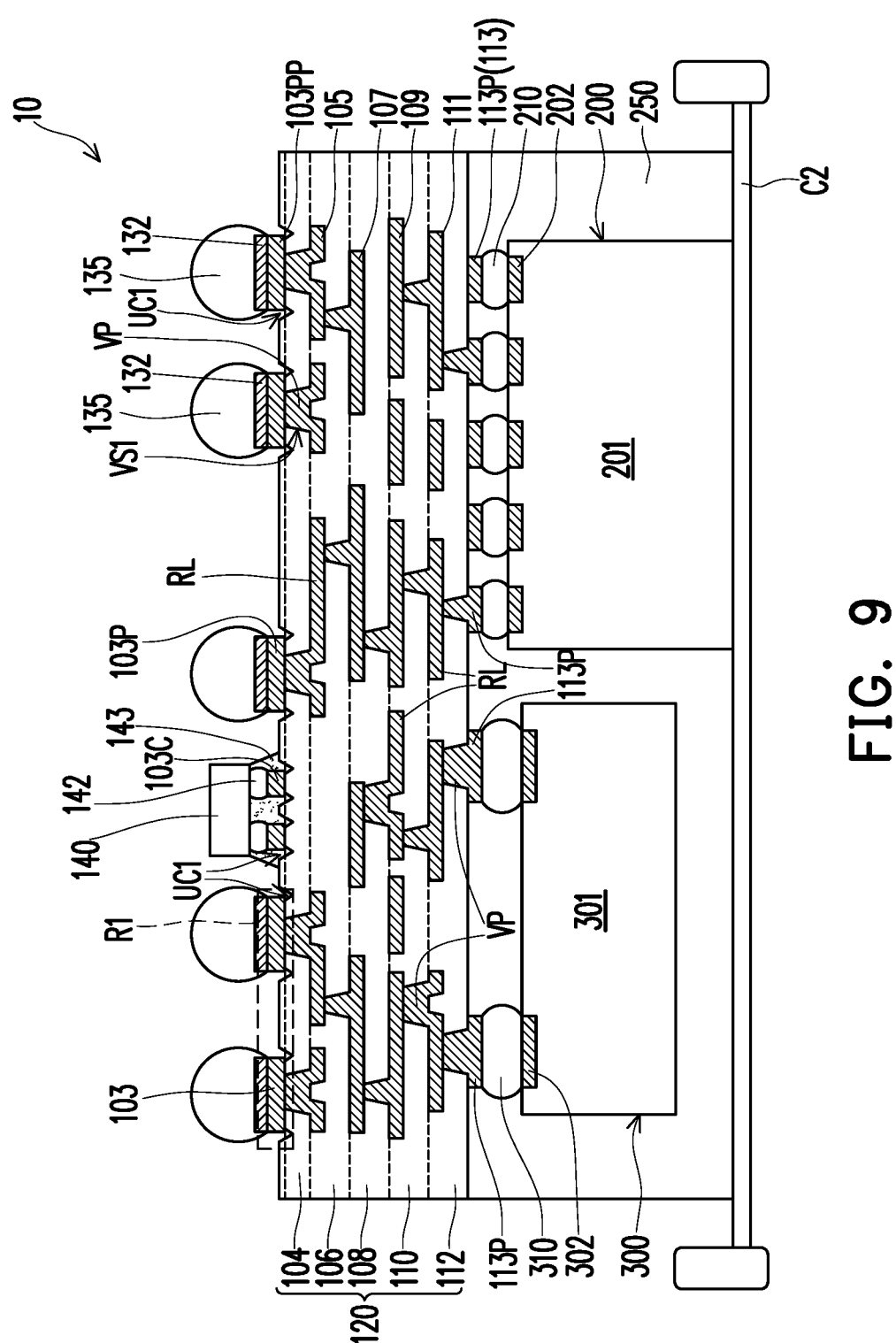

Referring to FIG. 8 and FIG. 9, the bumps 135 are formed on the metallic pads 103PP with the IMC layers 132 there-between, and at least one passive component 140 is bonded to the contact pads 103C through connectors 142. In some embodiment, an underfill 143 is formed below the passive component 140 and between the passive component 140 and the redistribution structure 120 and filling up the undercut cavities UC1 around the contact pads 103C. In some embodiments, the bumps 135 include ball grid array (BGA) bumps, C4 bumps, or solder bumps. In some embodiments, the passive component 140 includes one or more capacitors, resistors, inductors or the like. After forming the bumps 135 and bonding the passive component 140, a singulation process is performed to cut the structure 100 (cutting through the redistribution structure 120 and the insulating encapsulant 250) into package unit structures 10 (one is shown). In some embodiments, the singulation process includes a mechanical blade sawing process or a laser cutting process.

As shown in FIG. 9, after the singulation process, the separated package unit structure 10 includes the semiconductor dies 200 and 300 laterally wrapped by the insulating encapsulant 250, the redistribution structure 120 and the bumps 135 formed on the redistribution structure 120. As described in the previous paragraphs, the redistribution structure 120 includes the recess first dielectric layer 102R and the metallic pads 103PP, and the bumps 135 located on the metallic pads 103PP with the IMC layers 132 there-between. The redistribution structure 120 is electrically connected with the semiconductor dies 200 and 300 through the bumps 135. In one embodiment, the package unit structure 10 is an integrated fan-out (InFO) package structure.

Additionally, the semiconductor package 10 may further include additional dies or sub-package units disposed over the dies and another redistribution layer(s) may be formed to electrically connect the additional dies or sub-package units. The structures and/or the processes of the present disclosure are not limited by the exemplary embodiments.

Figure 10:
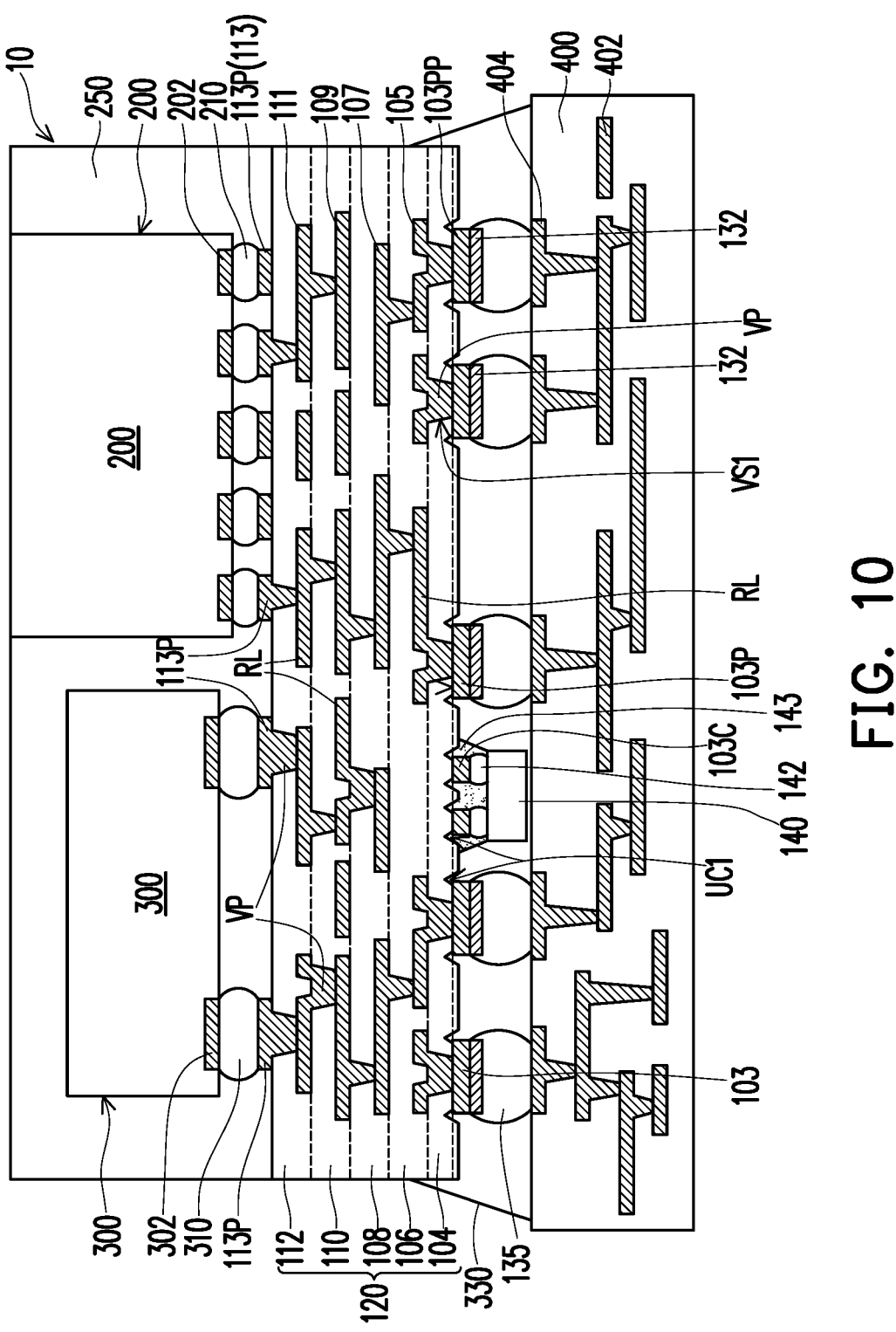

Referring to FIG. 10, in some embodiments, after detaching the package unit structure 10 from the carrier C2 and flipped upside down again, the package unit structure is bonded to a circuit substrate 400 to for a package structure 20. In some embodiments, an underfill 330 is optionally formed and filled between the package unit structure 10 and the circuit substrate 400. In some embodiments, the underfill 330 surrounds the bumps 135 and the passive component 140, and fills up the gaps between the bottom surface of the package unit structure 10 and the top surface of the circuit substrate 400. In some embodiments, the underfill 330 also partially covers the sidewalls of the package unit structure 10. In some embodiments, the undercut cavities UC1 surrounding the metallic pads 103P and metallic contacts 103C are covered and filled up by the underfill 330, so that the bottom edges of the metallic pads 103P and metallic contacts 103C exposed by the undercut cavities UC1 are covered by the underfill 330. That is, the edges of the metallic pads 103P or metallic contacts 103C are spaced apart from the surrounding dielectric layer by the underfill 330 filled in the undercut cavities UC1. In some other embodiments, the edges of the metallic pads 103P or metallic contacts 103C are exposed and spaced apart from the surrounding dielectric layer by the undercut cavities UC1, without forming the underfill. In some embodiments, the circuit substrate 400 includes a multilayered circuit substrate or an organic flexible circuit substrate.

In some embodiments, the above illustrate package structure may include or be a package including a multi-chip stacked package, a chip on wafer (CoW) package, an integrated fan-out (InFO) on organic substrate package, a package-on package (PoP), a chip-on-wafer-on-substrate (CoWoS) package, a three-dimensional integrated circuit (3DIC) package, or a combination thereof.

Figure 13:
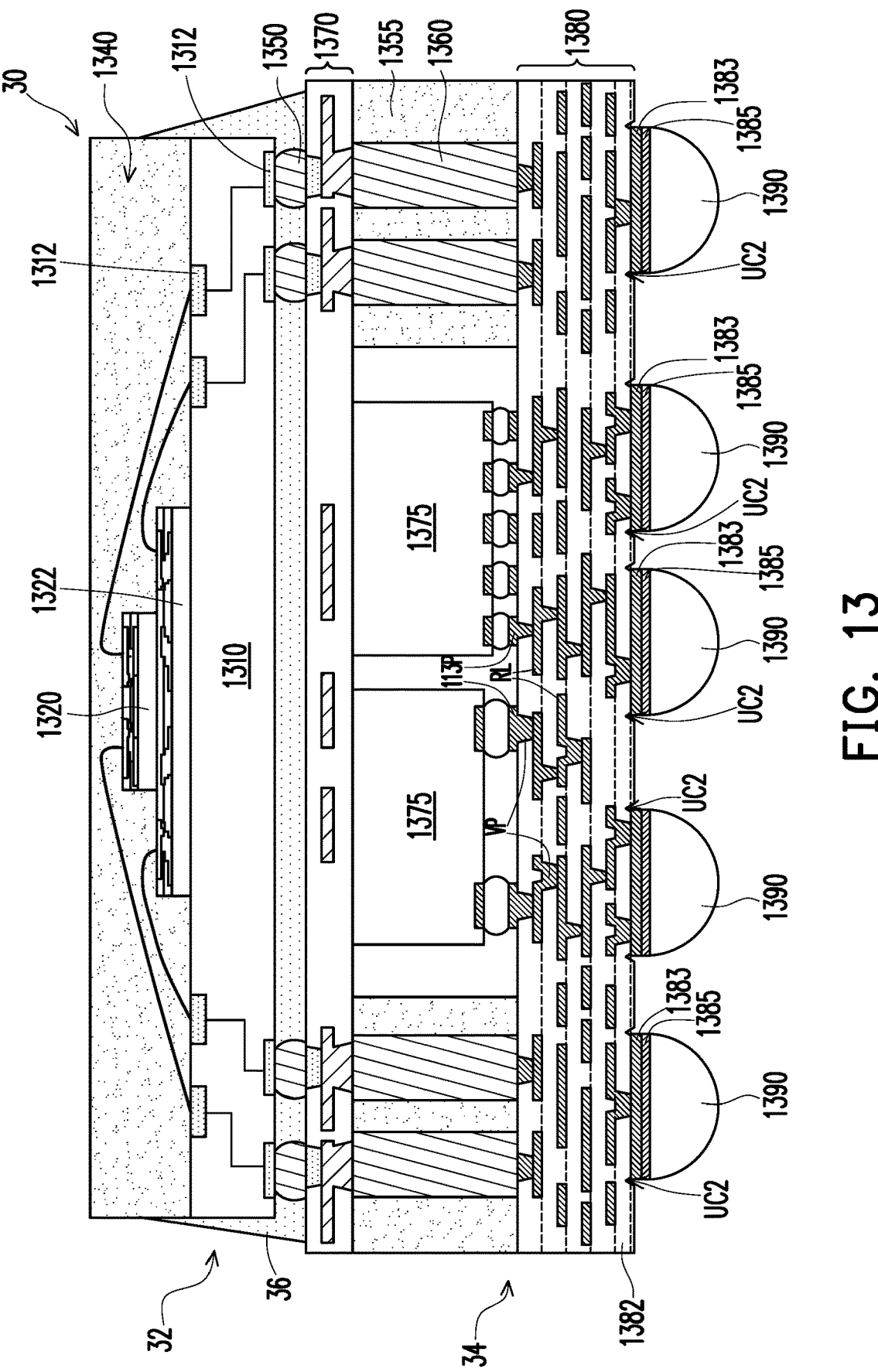
FIG. 13 is a schematic cross-sectional view of an integrated fan-out package-on-package (InFO PoP) semiconductor package in accordance with some embodiments of the present disclosure.

FIG. 13 illustrates a schematic cross-sectional view of an integrated fan-out package-on-package (InFO PoP) structure 30. As shown in FIG. 13, the InFO PoP structure 30 includes a top package unit 32 bonded with a bottom package unit 34, and the top package unit 32 is mechanically and electrically coupled to the bottom package unit 34 with an underfill material 36 is filled between the top package unit 32 and the bottom package unit 34. In some embodiments, the top package unit 32 has stacked dies 1320 and 1322 wire-bonded to contacts 1312 of a substrate 1310, and a molding layer 1340 is formed over the substrate 1310 to encapsulate semiconductor dies 1320 and 1322. In some embodiments, the dies 1320, 1322 includes different types of chips including memory chips and logic chips. It is understood that the dies 1320 and 1322 may be bonded using suitable methods such as bonding wires, bumps, or ball grid array (BGA) balls, to the substrate 1310. In some embodiments, the dies 1320 and 1322 are electrically coupled to the below bottom package unit 34 through the substrate 1310.

Referring to FIG. 13, the bottom package unit 34 is an InFO package structure, similar to the package unit as described in the previous embodiments. In some embodiments, the bottom package unit 34 includes semiconductor dies 1375, through insulator vias (TIVs) 1360 arranged around the semiconductor dies 1375, and the insulating encapsulant 1355 that laterally wraps around the semiconductor dies 1375 and the TIVs 1360. In some embodiments, the bottom package unit 34 includes a backside redistribution structure 1370 and a frontside redistribution structure 1380 and bumps 1390 formed on the frontside redistribution structure 1380. As described in the previous paragraphs, the frontside redistribution structure 1380, similar to the redistribution structure 120, includes the metallic pads 1383 with undercut cavities UC2 around the metallic pads 1383, and the bumps 1390 located on the metallic pads 1383 with the intermetallic compound (IMC) layers 1385 there-between. In some embodiments, the semiconductor dies 1320, 1322 of the top package unit 32 are electrically coupled with the semiconductor dies 1375 of the bottom package unit 34 through the connectors 1350, the backside redistribution structure 1370, the TIVs 1360 and the frontside redistribution structure 1380. In some embodiments, the semiconductor dies 1375 are electrically connected with redistribution structure 1380 and are further electrically connected with the bumps 1390.

Figure 11:
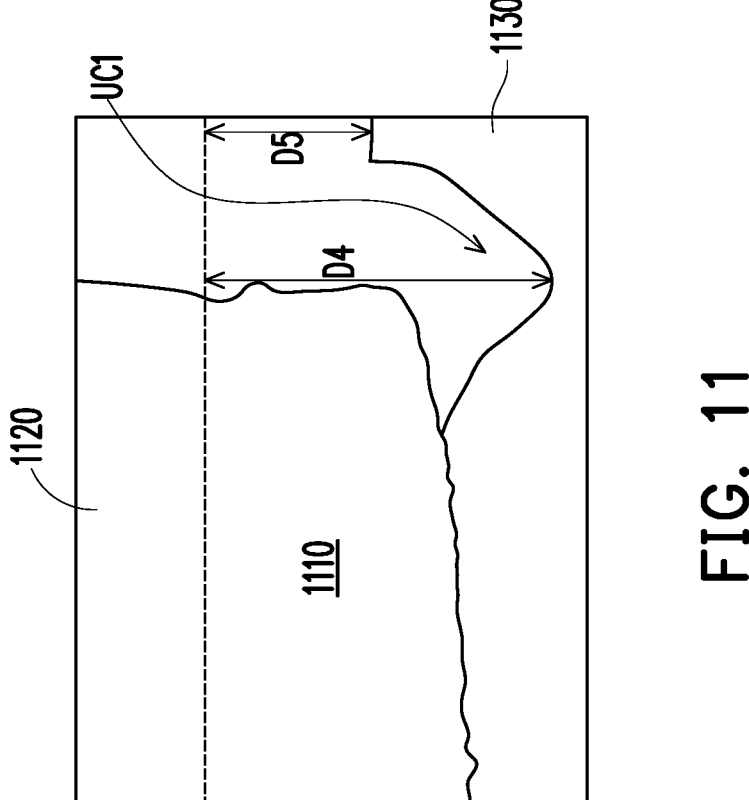
FIG. 11 and FIG. 12 are schematic views illustrating the profiles and the interfaces between the bump, the pad and the dielectric layer of the redistribution structure of the semiconductor package in accordance with some embodiments.
Figure 12:
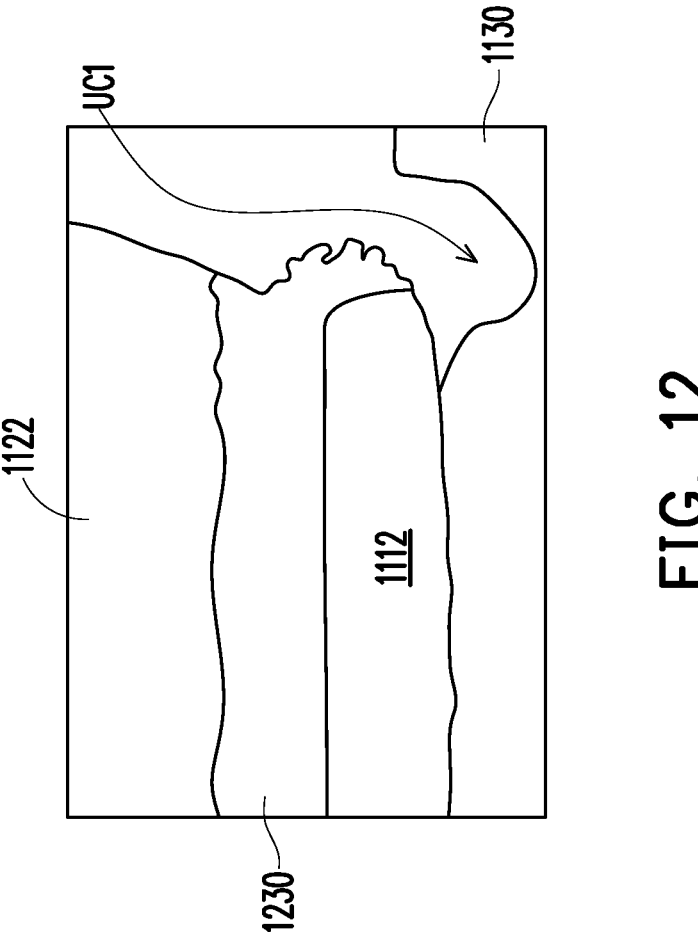

FIG. 11 and FIG. 12 are schematic views illustrating the profiles and the interfaces between the bump, the pad and the dielectric layer of the redistribution structure of the semiconductor package in accordance with some embodiments. Referring to FIG. 11, the bump block 1120 is located on the metallic pad 110, and the below dielectric layer 1130 has an undercut cavity UC1 around the metallic pad 110. As seen in FIG. 11, measuring from the interface between the bump block 1120 and the metallic pad 1110 (i.e. the top surface of the metallic pad 1110), the undercut cavity UC1 has a depth D4, and there is distance D5 between the interface and the top surface of the dielectric layer 1130. In one embodiment, the depth D4 is about 11.9 microns, and the distance D5 is about 5.6 microns. Referring to FIG. 12, after the reflow process, an intermetallic compound (IMC) layer 1230 is formed between the reflow bump 1122 and the partially consumed metallic pad 1112. It is seen that the undercut cavity UC1 surrounds the IMC layer 1230. That is, the dielectric layer 1130 is spaced apart from the sidewalls of the IMC layer 1230 through the formation of the undercut cavity UC1. Hence, no delamination or cracking of the dielectric layer near the bump(s) or bump pad(s) due to the thermal stress or the formation of the IMC layer.

Based on above, by recessing the outermost dielectric layer of the redistribution structure to form undercut cavities around the bump pads, the reliability of the bumps is improved with little delamination occurring around the bump pads. Also, the process window or the tolerance for the formed intermetallic compound layer becomes larger with the existence of the undercut cavities in the dielectric layer around the bump pads. Therefore, a redistribution structure that copes with the miniaturization scheme is realized.

In accordance with some embodiments of the present disclosure, a semiconductor package is disclosed. The package structure includes at least one semiconductor die laterally encapsulated by an encapsulant, a redistribution structure and bumps. The redistribution structure is disposed on the at least one semiconductor die and the encapsulant and is electrically connected with the at least one semiconductor die. The bumps are disposed on the redistribution structure at one side of the redistribution structure opposite to the other side at which the at least one semiconductor die is located. The redistribution structure includes dielectric layers and metallic pattern layers sandwiched between the dielectric layers. The redistribution structure includes metallic pads on an outermost dielectric layer of the dielectric layers, and the outmost dielectric layer has undercut cavities around the metallic pads.

In accordance with some embodiments of the present disclosure, a semiconductor package is provided. The package structure includes an encapsulated semiconductor die, a fan-out interconnecting structure, an underfill and a bump. The fan-out interconnecting structure is disposed over the encapsulated semiconductor dies and is electrically connected with the semiconductor die. The fan-out interconnecting structure includes a dielectric layer, and a metallic pad disposed on the dielectric layer, and the dielectric layer has at least one undercut cavity. The bump is disposed on the metallic pad. The underfill is disposed around the bump. An edge of the metallic pad is spaced apart from the dielectric layer by the underfill filled in the undercut cavity.

In accordance with some embodiments of the present disclosure, a method of manufacturing a semiconductor package including the following steps is provided. A redistribution structure is formed on a carrier, including forming metallic pads in a first dielectric layer, recessing the first dielectric layer to form undercut cavities in the first dielectric layer, and forming bonding pads on a second dielectric layer. Semiconductor dies are provided and bonded to the bonding pads of the redistribution structure. The semiconductor dies are encapsulated with an insulating encapsulant. After the carrier is removed, bumps are formed on the metallic pads.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A package structure, comprising:
   at least one semiconductor die having a first surface and a second surface opposite to the first surface and laterally encapsulated by an encapsulant;
   a redistribution structure, disposed on the first surface of the at least one semiconductor die and the encapsulant;
   bump connectors, located between the first surface of the at least one semiconductor die and the redistribution structure, and physically and electrically connected with contact pads located on the first surface of the at least one semiconductor die;
   bumps disposed on the redistribution structure at one side of the redistribution structure opposite to the other side at which the at least one semiconductor die and the bump connectors are located,
   wherein the redistribution structure includes dielectric layers and metallic pattern layers sandwiched between the dielectric layers, the redistribution structure includes metallic pads on an outermost dielectric layer of the dielectric layers, the bumps are located on the metallic pads with intermetallic compound layers sandwiched between the metallic pads and the bumps thereon, and the outmost dielectric layer has first undercut cavities beside the metallic pads.

2. The structure according to claim 1, wherein the bumps are located directly on the intermetallic compound layers on the metallic pads, and the first undercut cavities are located beside and around the bumps.

3. The structure according to claim 2, wherein an edge of the metallic pad is exposed by the first undercut cavity, and the first undercut cavity spatially isolates the metallic pad from the outermost dielectric layer.

4. The structure according to claim 1, wherein a sidewall of the intermetallic compound layer is exposed by the first undercut cavity.

5. The structure according to claim 1, wherein the first undercut cavity is a ring-shaped void trench with slant sidewalls or curved sidewalls.

6. The structure according to claim 1, wherein the redistribution structure includes metallic contacts on the outmost dielectric layer smaller than the metallic pads in sizes and located beside the metallic pads, and the outmost dielectric layer has second undercut cavities extending into the outmost dielectric layer and surrounding the metallic contacts.

7. A package structure, comprising:

an encapsulated semiconductor die;

a fan-out interconnecting structure, disposed over the encapsulated semiconductor die and physically connected to a first surface of the semiconductor die and electrically connected with the semiconductor die, wherein the fan-out interconnecting structure includes a dielectric layer, metallic contacts and a metallic pad disposed on the dielectric layer and beside the metallic contacts, and the dielectric layer has at least one first undercut cavity around the metallic pad and at least one second undercut cavity around one metallic contact of the metallic contacts;

a bump disposed over the metallic pad and an intermetallic compound layer sandwiched between the bump and the metallic pad; and an underfill, disposed around the metallic contacts and between the dielectric layer and the metallic contacts, beside the bump, wherein edges of the metallic contacts are spaced apart from the dielectric layer by the underfill filled in the at least one second undercut cavity.

8. The structure according to claim 7, wherein the at least one first undercut cavity is a ring-shaped void trench with slant or curved sidewalls.

9. The structure according to claim 7, wherein the bump covers a sidewall of the intermetallic compound layer without covering a sidewall of the metallic pad.

10. The structure according to claim 9, wherein the dielectric layer is spaced apart from the intermetallic compound layer by the at least one first undercut cavity.

11. The structure according to claim 7, wherein an orthogonal projection of the bump is larger than and overlaps with an orthogonal projection of the metallic pad.

12. The structure according to claim 11, wherein the at least one first undercut cavity surrounds a span of the bump from a top view.

13. The structure according to claim 7, further comprising a passive component connected to the metallic contacts and electrically connected to the fan-out interconnecting structure.

14. A method of manufacturing a semiconductor package, comprising:

forming a redistribution structure on a carrier, wherein forming the redistribution structure includes forming metallic pads in a first dielectric layer, and forming bonding pads on a second dielectric layer;

providing semiconductor dies and bonding the semiconductor dies to the bonding pads of the redistribution structure through bump connectors;

encapsulating the semiconductor dies with an insulating encapsulant;

removing the carrier, and after removing the carrier to expose the metallic pads and the first dielectric layer, recessing the first dielectric layer to form undercut cavities in the first dielectric layer around the metallic pads; and forming bumps on the metallic pads.

15. The method as claimed in claim 14, wherein recessing the first dielectric layer includes performing a dry etching process to selectively remove the first dielectric layer partially and to form the undercut cavities around edges of the metallic pads.

16. The method as claimed in claim 15, wherein the dry etching process is performed using a fluoride-containing etchant.

17. The method as claimed in claim 14, wherein forming bumps on the metallic pads includes forming intermetallic compound layers between the metallic pads and the bumps.

18. The method as claimed in claim 17, wherein the intermetallic compound layers are surrounded by the undercut cavities.

19. The structure according to claim 1, wherein the outmost dielectric layer has a first dielectric layer farthest from the first surface and a second dielectric layer between the first dielectric layer and the first surface, the first undercut cavities are defined by the first and second dielectric layers and extend from a surface of the first dielectric layer, extending vertically through the first dielectric layer and into the second dielectric layer with a depth.

20. The structure according to claim 6, further comprising a passive component bonded to the metallic contacts on the redistribution structure.

* * * * *